(12) United States Patent
Nath et al.

(10) Patent No.: US 6,729,081 B2
(45) Date of Patent: May 4, 2004

(54) SELF-ADHESIVE PHOTOVOLTAIC MODULE

(75) Inventors: Prem Nath, Rochester Hills, MI (US); Avtar Singh, Oak Park, MI (US); Kermit Jones, Rochester, MI (US); Steve Heckeroth, Albion, CA (US)

(73) Assignee: United Solar Systems Corporation, Troy, MI (US)

( * ) Notice: Subject to any disclaimer, the term of this patent is extended or adjusted under 35 U.S.C. 154(b) by 0 days.

(21) Appl. No.: 09/876,723

(22) Filed: Jun. 7, 2001

(65) Prior Publication Data

US 2001/0054262 A1 Dec. 27, 2001

Related U.S. Application Data

(63) Continuation-in-part of application No. 09/842,506, filed on Apr. 26, 2001, now Pat. No. 6,553,729.
(60) Provisional application No. 60/210,804, filed on Jun. 9, 2000.

(51) Int. Cl.⁷ .............................. E04D 3/18; H02N 6/00
(52) U.S. Cl. ........................ 52/173.3; 136/245; 136/251
(58) Field of Search ...................... 52/173.3; 136/245, 136/251

(56) References Cited

U.S. PATENT DOCUMENTS

| | | | |
|---|---|---|---|
| 4,217,364 A | 8/1980 | Kabara | |
| 4,226,898 A | 10/1980 | Ovshinsky et al. | |
| 4,442,148 A * | 4/1984 | Stierli | 428/40 |
| 4,463,043 A | 7/1984 | Reeves et al. | |
| 4,745,719 A | 5/1988 | Blankstein et al. | |
| 4,860,509 A | 8/1989 | Laaly et al. | |
| 5,202,271 A | 4/1993 | Kouzuma et al. | |
| 5,215,598 A | 6/1993 | Kouzuma et al. | |
| 5,273,608 A | 12/1993 | Nath | |
| 5,437,735 A | 8/1995 | Younan et al. | |
| 5,474,620 A | 12/1995 | Nath et al. | |
| 5,482,569 A | 1/1996 | Ihara et al. | |
| 5,507,880 A | 4/1996 | Ishikawa et al. | |
| 5,516,704 A | 5/1996 | Yoshida | |
| 5,575,861 A | 11/1996 | Younan et al. | |
| 5,582,653 A | 12/1996 | Kataoka et al. | |
| 5,800,631 A | 9/1998 | Yamada et al. | |
| 5,968,287 A | 10/1999 | Nath | |
| 5,998,729 A | 12/1999 | Shiomi et al. | |
| 6,155,006 A | 12/2000 | Mimura et al. | |
| 6,160,215 A * | 12/2000 | Curtin | 136/244 |
| 6,204,443 B1 | 3/2001 | Kiso et al. | |
| 6,294,725 B1 * | 9/2001 | Hirschberg et al. | 136/244 |
| 6,307,144 B1 | 10/2001 | Mimura et al. | |
| 6,320,117 B1 * | 11/2001 | Campbell et al. | 136/245 |
| 6,380,477 B1 * | 4/2002 | Curtin | 136/244 |
| 6,380,480 B1 * | 4/2002 | Norimatsu et al. | 136/249 |
| 6,401,424 B2 * | 6/2002 | Folkersen | 52/746.11 |
| 2001/0054435 A1 | 12/2001 | Nagao et al. | |

FOREIGN PATENT DOCUMENTS

GB    2 296 263 A    6/1996

* cited by examiner

Primary Examiner—Brian E. Glessner
(74) Attorney, Agent, or Firm—Gifford, Krass, Groh, Sprinkle, Anderson & Citkowski, P.C.

(57) ABSTRACT

A photovoltaic building material comprises a substrate having one or more photovoltaic generating devices encapsulated thereupon. The substrate includes a body of contact adhesive material, preferably protected by a release layer. The material is readily installed onto a roof, wall or other portion of a building structure by use of the adhesive. The material can also be used for the custom fabrication of power generating modules, and such modules and methods for their manufacture are disclosed herein.

36 Claims, 2 Drawing Sheets

SELF-ADHESIVE PHOTOVOLTAIC MODULE

RELATED APPLICATIONS

This patent application claims priority of provisional patent application Ser. No. 60/210,804 filed Jun. 9, 2000; and it is a continuation-in-part of U.S. patent application Ser. No. 09/842,506 filed Apr. 26, 2001, now U.S. Pat. No. 6,553,729, both of which are entitled "Self-Adhesive Photovoltaic Module."

FIELD OF THE INVENTION

This invention relates generally to photovoltaic devices and more particularly to a building material which is capable of generating electrical power. Most specifically, the invention relates to a power generating material which is flexible, lightweight and self-adhesive.

BACKGROUND OF THE INVENTION

Photovoltaic energy is becoming a very significant source of electrical power. This is because problems of scarcity and safety have limited the use of fossil and nuclear fuels, and recent advances in photovoltaic technology have made possible the large scale manufacture of low cost, lightweight, thin film photovoltaic devices. It is now possible to manufacture large scale, thin film silicon and/or germanium alloy materials which manifest electrical and optical properties equivalent, and in many instances superior to, their single crystal counterparts. These alloys can be economically deposited at high speed over relatively large areas and in a variety of device configurations, and as such they readily lend themselves to the manufacture of low cost, large area photovoltaic devices. U.S. Pat. Nos. 4,226,898 and 4,217,364 both disclose particular thin film alloys having utility in the manufacture of photovoltaic devices of the type which may be employed in the present invention. However, it is to be understood that the present invention is not limited to any particular class of photovoltaic materials and may be practiced with a variety of semiconductor materials including crystalline, polycrystalline, microcrystalline, and noncrystalline materials.

The power generated by a photovoltaic device is proportional to the illumination incident thereupon, and if relatively large amounts of power are to be generated, fairly large collection areas are required. The roof and upper story areas of building structures are well illuminated and are generally not put to productive use. For some time now it has been known to place photothermal and photovoltaic collectors on the top portions of buildings. Such prior art approaches include mounting of photovoltaic panels on buildings through the use of rigid mounting brackets. In other instances, photovoltaic devices are configured into roofing tiles. The use of such materials requires special installation techniques and hardware. In addition, such prior art devices and mounting hardware tend to be heavy; therefore, building structures must be reinforced to accommodate their use. In fact, building codes in many areas mandate reinforcement and redesign of roofing structures if weight loadings in excess of two pounds per square foot are added thereto.

In addition to being heavy, prior art devices tend to be rigid, and this rigidity, together with weight, complicates shipping, handling and installation. Further problems of installation occur when photovoltaic devices are mounted, since mounting typically requires use of special frames and/or fasteners such as nails and screws which penetrate the photovoltaic device or mounting structure. The use of penetrating fasteners is complicated by the fact that such fasteners should not penetrate the photovoltaically active portions of a roofing material. Therefore, complex mounting hardware is frequently required to assure that photovoltaic devices are retained on a building structure with sufficient integrity to resist storm conditions. The prior art has implemented a number of approaches to the fabrication of photovoltaic roofing materials. For example, U.S. Pat. Nos. 5,092,939; 5,232,518 and 4,189,881 disclose photovoltaic roofing structures of the batten and seam type. U.S. Pat. No. 4,860,509 discloses roll type roofing material having photovoltaic devices incorporated therein. U.S. Pat. Nos. 5,575,861 and 5,437,735 disclose photovoltaic shingles.

Despite the advances made in photovoltaic roofing materials, there is still a need for a photovoltaic building material which is light in weight, flexible enough to be installed over irregular surfaces, and capable of being retained onto a building structure without the use of significant numbers of fasteners or extraneous hardware. In addition, such material should be resistant to the spread of fire.

Photovoltaic building materials frequently include polymeric encapsulant, asphalt based sealers, fibrous support materials and the like, all of which can be flammable, particularly given the fact that such materials are usually used in the form of relatively thin sheets. Building codes generally set flammability standards for construction materials. Such standards specify the rate at which flame will spread across a material. When relatively flammable materials are incorporated into building structures, insurance rates for the buildings may be increased to the point that construction is prohibitive. Also, in many cases, building codes are strict enough to preclude the use of flammable materials. Therefore, it is further desirable that any photovoltaic building material have a relatively low rate of flame spread.

The present invention provides a low cost, flexible photovoltaic building material which is lightweight, self-adhesive, and which can be easily and fixedly attached to a variety of building structures. The material of the present invention is relatively low in cost and can be shipped in a rolled form. In addition, the material has a low flammability and can also be configured to include firebreak structures which limit flame spread. Additionally, the self-adhesive nature of the material of the present invention allows the material to be adapted to a number of other applications including lightweight power generating modules, vehicles, consumer products, and the like. These and other advantages of the present invention will be apparent from the drawings, discussion and description which follow.

BRIEF DESCRIPTION OF THE INVENTION

There is disclosed herein a photovoltaic building material which comprises a generally planar, flexible substrate having a first and a second opposed side. A photovoltaic device, operative to generate a current in response to the absorption of incident light, is supported on the substrate so that the bottom side of the photovoltaic device faces the first side of the substrate and the top, light incident, side of the photovoltaic device faces away from the substrate. An encapsulant material covers the light incident side of the photovoltaic device and affixes that device to the substrate. At least that portion of the encapsulant material which covers the light incident side of the photovoltaic device is light transmissive. The photovoltaic building material further includes a body of contact adhesive covering at least a portion of the second side of the substrate. The contact adhesive is employed to affix the module onto a building structure. The building material may be configured to have a weight of no more than two pounds per square foot.

In specific embodiments, the contact adhesive is covered by a sheet of release material. The adhesive, in one preferred embodiment, comprises a rubberized asphalt. The substrate may be any typical roofing material such as metallic foils, polymeric membranes, polymer impregnated fiber mats, and the like taken either singly or in combination.

In some preferred embodiments, the module includes a plurality of separate photovoltaic devices disposed on the substrate in a spaced apart relationship. Firebreak members may be disposed so as to span the module, preferably between discrete photovoltaic devices.

In some specific applications, the material of the present invention may be adhered to a lightweight support member, such as a sheet of polymeric material, so as to produce a lightweight module. This module may further include ancillary equipment such as inverters, power controllers, charge controllers, terminal assemblies, power storage devices and the like affixed thereto or integrated therewith.

DETAILED DESCRIPTION OF THE INVENTION

The present invention is directed to a photovoltaic building material. It is to be understood that, in the context of this disclosure, a building material refers to a generally weather resistant structural material having sufficient integrity to use as a primary or supplementary covering for a portion of a building structure, and as such includes material adapted to be disposed upon a roof of a building, as well as sheathing material configured to be disposed onto an exterior surface of a building. The building material of the present invention is characterized in that it is capable of generating photovoltaic power and is self-adhesive. By self-adhesive is meant that the material includes an adhesive which functions to retain it onto a building structure, without the need for other fasteners.

Figure 1:
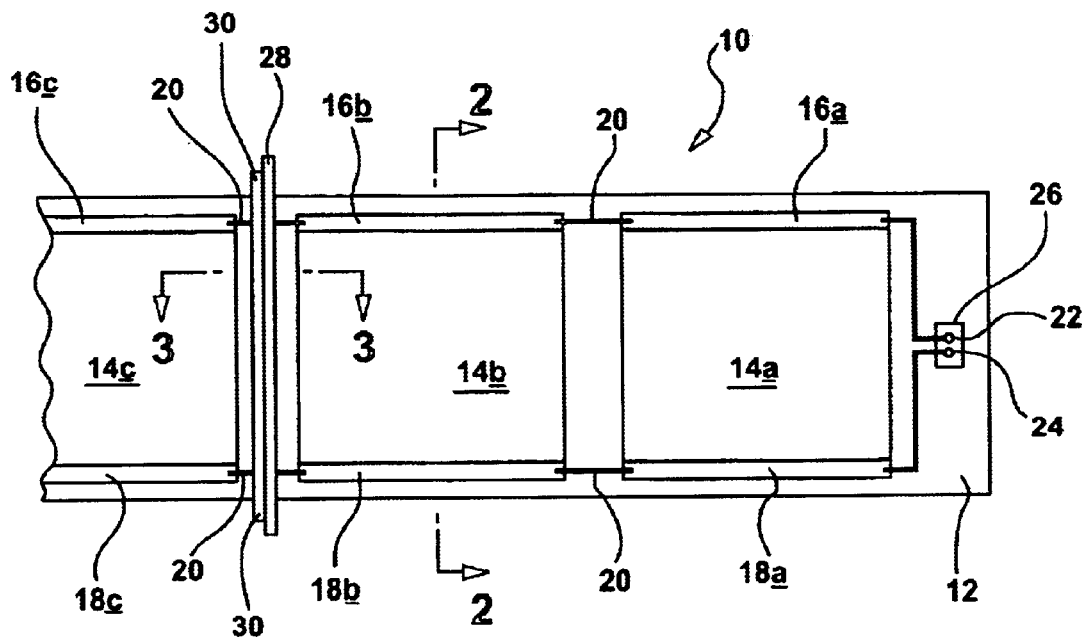
FIG. 1 is a top plan view of a photovoltaic building material structured in accord with the principles of the present invention.

Referring now to FIG. 1, there is shown a top plan view of a segment of a generally elongated, self-adhesive, photovoltaic building material 10 structured in accord with the principles of the present invention. The photovoltaic building material 10 includes a number of photovoltaic devices 14a–14c supported thereupon in a spaced apart relationship. The photovoltaic devices 14a–c are operative to absorb incident light and generate a photocurrent in response thereto. As is known in the art, this photocurrent is typically conveyed to one or more bus bars associated with each device for collection, and as illustrated, each device 14 includes a first 16 and a second 18 bus bar in electrical communication with an electrode of the photovoltaic device 14. As illustrated, the bus bars 16, 18 are disposed on a top, light incident surface of the photovoltaic device; although, it is to be understood that, depending on the particular configuration of the photovoltaic device, the bus bars may be otherwise disposed, or in some instances may be eliminated. As further illustrated in FIG. 1, the photovoltaic devices 14 are electrically interconnected by means of leads 20, and all of the devices are in electrical communication with a pair of terminals 22, 24, which in this embodiment are disposed in a junction box 26 which is supported on the substrate 12 of the material 10. As illustrated, the photovoltaic devices 14 are electrically interconnected in a parallel arrangement; although, in other embodiments, they may be interconnected in a series arrangement, or in a mixed series/parallel arrangement so as to provide an appropriate voltage and power output.

As discussed hereinabove, it is generally desirable to limit the propagation of flame across roofing materials and the like. In this regard, the photovoltaic material 10 of FIG. 1 includes a firebreak 28. The firebreak, as will be explained in detail hereinbelow, is, in this embodiment, configured as an L-shaped member, preferably fabricated from sheet metal stock. The firebreak 28 spans the entire width of the substrate 12 and projects therebeyond. The firebreak may include fastener holes 30 which could be used to affix the firebreak to a supporting structure. The firebreak 28 is preferably disposed between photovoltaic devices, so as to minimize shading effects which would decrease photovoltaic output.

Most preferably, the photovoltaic building material has a weight of no more than two pounds per square foot. Lightweight photovoltaic devices fabricated from thin film semiconductor alloys are known in the art. By the use of such devices in conjunction with other materials, this weight limit can be met. As is discussed above, limiting the weight of the material will avoid the need for adding further weight bearing structures to the building, as is required for many prior art photovoltaic generators.

Figure 2:
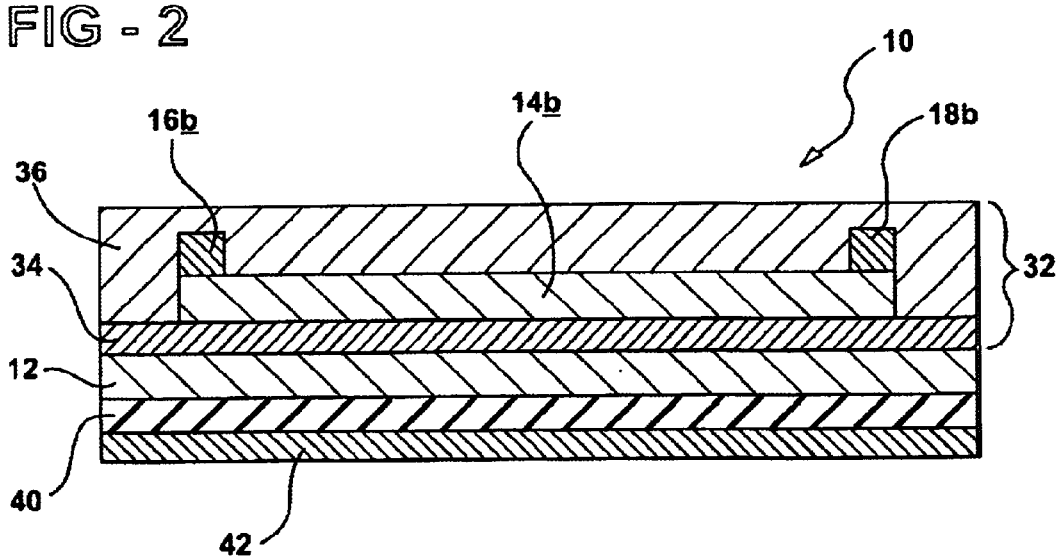
FIG. 2 is a cross-sectional view of the building material of FIG. 1 taken along line 2—2.

Referring now to FIG. 2, there is shown a cross-sectional view of the photovoltaic building material 10 of FIG. 1 taken along line 2—2, and better illustrating the structure of the various layers comprising the material 10. It is to be understood that the thicknesses of various of the layers have been exaggerated for purposes of illustration.

The material 10 of FIG. 2 includes a body of substrate material 12 which supports the remaining layers thereof. The substrate material 12 is preferably a conventional roofing material such as metal foil, a polymeric membrane, or a body of fibrous material such as woven or nonwoven cloth, paper and the like impregnated with a polymeric material such as asphalt, tar or synthetic polymers. The substrate material 12 is preferably flexible, and should be water resistant. The photovoltaic device 14b is supported on a first surface of the substrate material 12. The photovoltaic device 14b may be any photovoltaic device known in the art. Most preferably, the photovoltaic device 14b is flexible and lightweight. Photovoltaic devices fabricated from thin film semiconductor material such as silicon, germanium, and silicongermanium alloyed with hydrogen and/or halogens and/or dopant materials may be employed with particular advantage to fabricate lightweight, thin film photovoltaic devices having good efficiencies and long service lives, and such materials are employed in one particularly preferred embodiment of the present invention. Other preferred thin film materials include copper indium diselenide, cadmium sulfide and the like. The principles of the present invention may be advantageously practiced in connection with other photovoltaic devices such as crystalline silicon devices, polycrystalline silicon devices, and the like. As illustrated, the photovoltaic device 14b includes bus bars 16b, 18b which are in communication with the positive and negative electrodes of the device. As illustrated, both bus bars are disposed on a top, light incident surface of the photovoltaic device; however, it is to be understood that in some instances, bus bars or other current collecting structures may be otherwise disposed, or in some instances eliminated. All of such embodiments are within the scope of the present invention.

The photovoltaic device 14b is retained on the substrate by a body of encapsulant material 32. This encapsulant material is electrically insulating, and resistant to ambient atmospheric conditions. Among the preferred encapsulant materials are polymers, including fluoropolymers. As illustrated in FIG. 2, the encapsulant material 32, in this embodiment, comprises a first layer of material 34 which covers the bottom surface of the photovoltaic device 14 and adheres the device to the substrate 12, and a top layer 36 which covers the remainder of the photovoltaic device 14. At least those portions of the encapsulant material 32 which cover the light incident side of the photovoltaic device 14b should be light transmissive. The encapsulant material may comprise a single body of material, or, more preferably, a plurality of layers. One particularly preferred embodiment of encapsulant material comprises a body of relatively soft, thermosetting polymer such as ethylenevinylacetate (EVA), which is used in conjunction with outer protective layers of a fluoropolymer such as a copolymer of ethylene and tetrafluoroethylene sold by the DuPont Corporation under the trade name Tefzel®. Another protective material is a polyvinylidene fluoride sold by the DuPont Corporation under the name Tedlar®. In some instances, glass fiber material may be incorporated into the body of encapsulant to further increase the durability and cut resistance thereof. Encapsulant materials having utility in the present invention are disclosed in U.S. Pat. No. 5,474,620, the disclosure of which is incorporated herein by reference.

The photovoltaic material of the present invention further includes a body of contact adhesive material 40 disposed so as to cover at least a portion of the bottom surface of the substrate 12. Within the context of this disclosure a contact adhesive is understood to mean an adhesive which does not require chemical curing, thermal curing, or significant heat and pressure to effect bonding. A variety of contact adhesive materials are known in the art. One particularly preferred material comprises rubberized asphalt. Self-adhesive, non-photovoltaic roofing material is known in the building arts. For example, self-stick aluminum roll roofing is sold by MFM Building Products Corp. of Coshocton, Ohio under the designation "Peel and Seal," and is comprised of aluminum foil and polymer film having a rubberized adhesive backing. Materials of this type may be readily adapted to the practice of the present invention.

In other embodiments of the present invention, the substrate 12 comprises a body of woven or nonwoven fabric, paper, or the like saturated with a contact adhesive material. In other instances, the substrate itself can be comprised of a monolithic sheet of a flexible adhesive material having structural integrity and two faces capable of contact bonding. Adhesive material of this type is known in the art and is sold, for example, by MFM Building Products under the designation "MFM Double Bond." This material is supplied in sheet form having a body of release material on each face thereof. In the present invention, a first face of this dual faced adhesive material can be adhered to a photovoltaic unit, and a second face thereof subsequently adhered to a building structure. In some instances, the bottom layer of encapsulant material 34 can be eliminated from the photovoltaic structure, and the photovoltaic device 14 and top encapsulant layer 36 can be directly adhered to the first face of the dual faced adhesive. There is particular advantage to using material of this type, since it eliminates the cost of the bottom encapsulant layer 34. Also, in many instances, the dual faced adhesive material has a higher fire resistance than does the layer of bottom encapsulant material 34; and as a consequence, structures so configured have an improved fire resistance rating.

There are a variety of adhesive materials which may be used in the present invention. Most preferably, such materials comprise water-resistant contact adhesives, since the water resistance provides a structure which is resistant to ambient atmosphere conditions. Relatively thick, soft, adhesive materials such as rubberized asphalt, polymers and the like further enhance building structure integrity by sealing nails, holes, cracks and the like against the ambient atmosphere. Rubberized asphalts of the type discussed above comprise one preferred class of contact adhesives, and as is known in the art, these materials comprise, on a weight basis, approximately 40–60% asphalt; 10–20% of a rubber, such as styrene-butadiene-styrene block copolymer (or natural rubber); together with a relatively small amount of a plasticizer such as aromatic oil in an amount of up to 10%. Another preferred adhesive material comprises an ethylene propylene copolymer, and one such material is available in the form of tape which includes rubber and inert organic fillers. Such material is commercially available under the designation SikaLastomer®-68 from the Sika Corporation of Madison Heights, Mich. Other such contact adhering sealant materials are known in the art and can be used in the present invention.

As is further noted in FIG. 2, the building material of the present invention includes a release layer 42 disposed so as to cover the contact adhesive 40. The release layer 42 preferably comprises a body of paper coated with a low surface energy material such as silicone resin. Alternatively, the release layer may be fabricated from a polymeric body. As is understood in the art, the purpose of the release layer 42 is to protect the adhesive 40 during shipping and handling.

The material of the present invention may be readily rolled up for transport and storage, and installed onto a building structure by cutting it to length, preferably between photovoltaic devices, removing the release layer 42, and applying gentle pressure so as to effect a contact bond of the adhesive 40 to an underlying building structure. Final installation is completed by connecting the electrical terminals to an appropriate power circuit.

Figure 3:
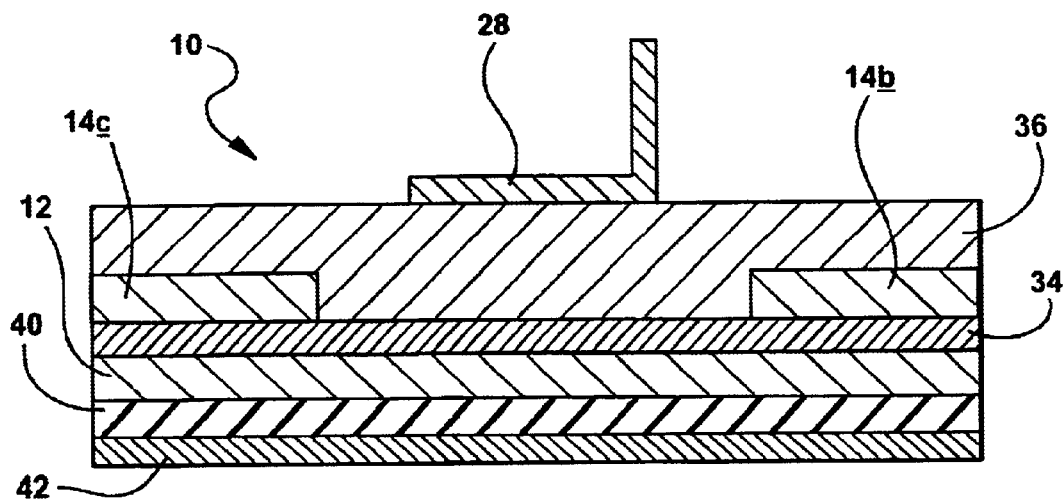
FIG. 3 is a cross-sectional view of the material of FIG. 1 taken along line 3—3.

Referring now to FIG. 3, there is shown a cross-sectional view of the material 10 of FIG. 1 taken along line 3—3. The body of material 10 illustrated in FIG. 3 includes substrate 12, adhesive layer 40 and release layer 42 all as previously described. As illustrated in FIG. 3, the material 10 includes photovoltaic devices 14b and 14c which, as previously discussed, are retained on the substrate 12 by an encapsulant material, which includes layers 34 and 36.

FIG. 3 further illustrates a firebreak 28 as incorporated into the present invention. The firebreak of this embodiment comprises a generally L-shaped member disposed so that a first leg thereof is generally parallel to the substrate 12, and a second leg thereof projects away from the substrate. The firebreak 28 is most preferably fabricated from sheet metal stock and is adhesively adhered to the top encapsulant layer 36 of the material. As discussed hereinabove, the firebreak 28 preferably protrudes beyond the edges of the substrate 12, and can be fastened to a subjacent building structure by nails, screws or the like. In operation, the firebreak 28 prevents the propagation of flame along the length of the photovoltaic building material 10, by shielding portions of the material from air, and by providing a heat sinking effect. Also, the upstanding portion of the firebreak prevents flames from traveling across the body of material. It is to be understood that firebreaks are an optional aspect of the present invention, but are advantageously included therein. Also, the firebreaks may be configured other than as depicted herein.

The photovoltaic building material of the present invention may be fabricated in a variety of configurations, and owing to its high adhesion to a number of different substrates, can be utilized in various applications. For example, photovoltaic shingle structures have been implemented in the prior art, as is shown in U.S. Pat. Nos. 5,575,861 and 5,437,735. Such structures are quite attractive and blend well with conventional roofs; however, photovoltaic generators are advantageously manufactured as large area devices, while conventional roofing shingles are formed as relatively narrow strips of material. As a consequence, photovoltaic shingle structures configured to match conventional shingle geometry of necessity include a large number of electrical leads which must be either separately interconnected or passed through a roofing structure for connection within the building. Larger area shingle structures are not advantageously employed, since such structures are very prone to wind lifting and damage in storms. However, through the use of the present invention, combined with embossing and patterning techniques, it has been found that the advantages of large area photovoltaic structures can be combined with the aesthetic appeal of conventional small geometry roof shingles.

Figure 4:
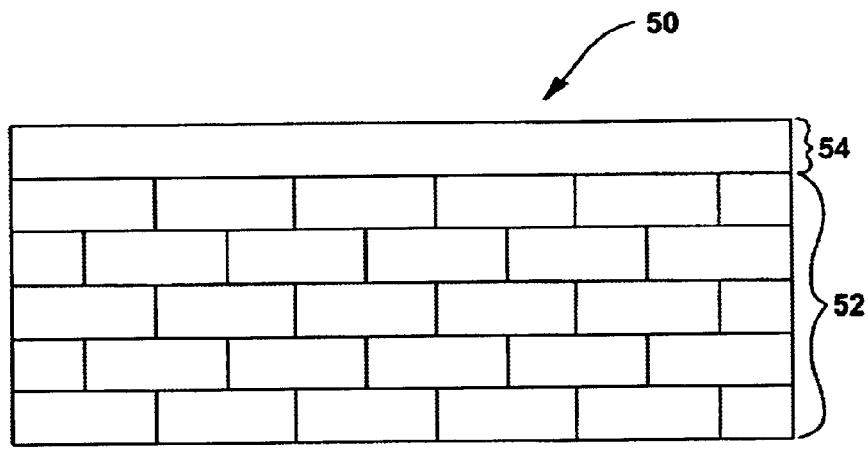
FIG. 4 is a top plan view of another embodiment of building material of the present invention configured as a roofing panel.

Referring now to FIG. 4, there is shown a photovoltaic roofing material structured in accord with the present invention and configured to resemble a block of small geometry shingles. The photovoltaic panel 50 of FIG. 4 comprises a relatively large area photovoltaic generator generally similar to the photovoltaic building material of FIG. 1, insofar as it includes a number of large area photovoltaic devices laminated to a self-adhesive body of material as previously described. The photovoltaic devices are all within a photovoltaically active area 52, and this area has been patterned by embossing the upper encapsulant layer thereof in a shingle pattern. The photovoltaic structure 50 of FIG. 4 further includes an overlap area 54, which most preferably is photovoltaically inactive. This area may or may not include an embossing pattern.

Figure 5:
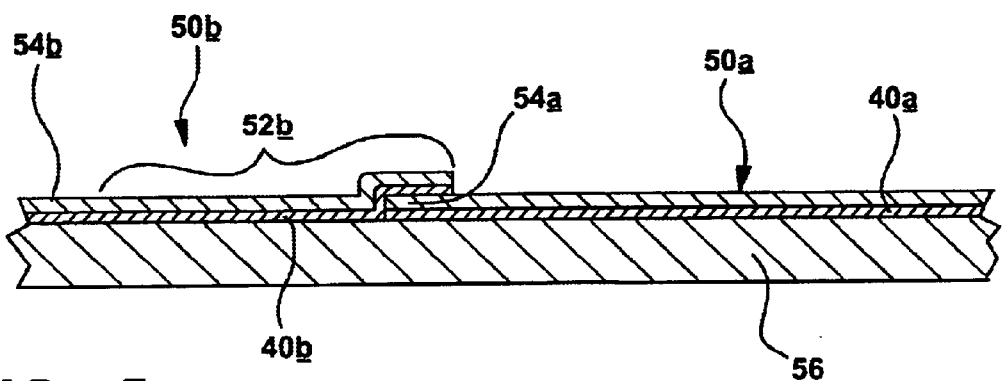
FIG. 5 is a cross sectional view showing two roofing panels of FIG. 4, attached to a roof deck.

In use, a number of strips of the photovoltaic material 50 of FIG. 4 are attached to a roof deck in an overlapping relationship so that the photovoltaically active portion of a first strip lies atop the overlap region 54 of a second strip, as is best seen in FIG. 5. Shown therein is a roof deck 56, which may comprise a sheet of plywood, a sheet of metal, a roofing membrane or the like. Disposed atop the deck is a first photovoltaic generator 50a described above. As will be noted, a body of adhesive material 40 affixes the entirety of the generator 58 to the deck 56 and a second photovoltaic generator 50b is also affixed to the deck in an overlapping relationship with the first generator 50a so that the overlap portion 54 of the first generator 50a is covered by a part of the photovoltaically active portion 52 of the second photovoltaic generator 50b. The entirety of the second generator 50b is adhesively affixed to either the deck 56 or to the overlap portion 54 of the first generator 50a. Still further panels may be likewise affixed to the deck in an overlapping relationship.

Given the fact that the entirety of the generating panels is adhesively retained, relatively large panels, typically one to four feet wide, may be employed for roofing without danger of being damaged by high winds. In this manner, a roof having the appearance of individual shingle strips can be quickly built up from a number of very large panels of material of the present invention, and without requiring a large number of interconnections and/or through-holes in the roof.

It is to be understood that while the material of the present invention has been described primarily as a roofing material, the material may also be used advantageously for sheathing walls, canopies, and other portions of building structures.

The photovoltaic building material of the present invention is capable of adhering to a variety of substrates including brick, steel and wood. Consequently, the material can be used in a variety of other applications. For example, photovoltaic devices configured according to the present invention can be permanently affixed to the roofs or trunk decks of automobiles to provide supplemental battery charging power when the vehicle is not in use. Likewise, the devices of the present invention can be affixed to watercraft and aircraft.

The self-adhesive nature of the material also permits it to be used in a number of other building applications. For example, photovoltaic devices are often incorporated into batten and seam roofing panels, and such panels are described in various of the patents referred to herein. Typically, such roofing material is prepared offsite by pressure laminating or otherwise affixing photovoltaic devices to a series of roof pans. In some instances, lamination is carried out on site through the use of specific laminating devices as described in U.S. Pat. No. 5,968,287. Through the use of the present invention, the fabrication of such batten and seam roofing panels is greatly simplified, since the panels can be fabricated on site without utilizing any additional laminating equipment.

Because of its light weight, flexibility, and self-adherent properties, the photovoltaic material of the present invention may be used as a stock material for the fabrication of a variety of specialized photovoltaic devices. In one such application, the self-adhesive material may be employed for the fabrication of customized photovoltaic power modules of various preselected sizes, shapes and power generating capabilities. In this specific application, the self-adhesive material of the present invention is adhered to an appropriate supporting member to form the custom module.

For example, in accord with the present invention, lightweight power generating panels may be readily fabricated by adhering the photovoltaic material of the present invention to a lightweight support member. One particularly preferred group of supports comprises polymeric sheet stock. One specifically preferred polymeric material comprises polycarbonate stock. Polycarbonate polymers are light in weight, strong and environmentally stable. Such material is readily available in a variety of sizes and thicknesses. In general, it has been found that thicknesses in the range of one-sixteenth inch to one-quarter inch are generally sufficient for photovoltaic module fabrication; although, certain applications may employ thinner substrates, and in certain applications, particularly where very high strength is required and/or very large modules are being fabricated, thicker materials may be employed. A standard size for polycarbonate sheet material is four by eight feet, and this size is compatible with many building applications, and also provides for a convenient to handle and use power module.

Another particularly preferred polymeric material for the support member comprises honeycomb-cored structural panels. These materials are formed from an extruded polypropylene core having facing panels adhered thereto. They are very light in weight and have stiffness, structured integrity and environmental stability which make them well suited for use as support members for photovoltaic modules. Panels of this type are available from the Nida-Core corporation of Palm City, Fla.

In this specific application, the self-adhesive photovoltaic material is affixed to a polymeric support member such as the aforementioned polypropylene cored sheets or polycarbonate sheet stock. The support member may optionally include mounting hardware, stiffening brackets, and like mechanical structures, as is known in the art, and as may be required for particular applications. In accord with a further aspect of the present invention, the support may also include ancillary photovoltaic power equipment and structures supported thereon. For example, the support member may have an inverter affixed thereto for converting the DC output of the photovoltaic device into alternating current. Likewise, other power conditioning equipment such as transformers, charge controllers and the like may be affixed to the substrate. These ancillary devices can be formed as an integral portion of the support member; although, they may also be provided as adhesively affixable devices which can be mounted on the front or back side of the resultant module. Yet other ancillary equipment and structures such as storage batteries, illumination devices, and the like may be similarly affixed to the module. By making these devices adhesively affixable, modules may be readily fabricated either on site, or near to the point of use by employing generalized stock material. In this matter, handling, storage, and inventory of specialized parts is minimized.

Thus, it will be understood that the self-adhesive photovoltaic material of the present invention may be most advantageously employed for the fabrication of customized photovoltaic modules and devices; and that the use of the material of the present invention eliminates problems associated with material handling and control, and thereby permits the low cost manufacture of a variety of different device configurations and types.

The material of the present invention may be implemented utilizing photovoltaic devices and materials other than those specifically described herein. Thus, it is to be understood that numerous modifications and variations of the present invention may be implemented, and the foregoing drawings, discussion and description are illustrative of particular embodiments of the invention, but are not meant to be limitations upon the practice thereof. It is the following claims, including all equivalents, which define the scope of the invention.

What is claimed is:

1. A photovoltaic building material comprising:
   a generally planar, flexible substrate having a first side and a second side opposed to said first side;
   a photovoltaic device operative to generate an electrical current in response to the absorption of light incident thereupon, said photovoltaic device being affixed to said substrate so that a bottom side thereof faces the first side of said substrate, and so that a top, light incident, side thereof faces away from said substrate;
   an encapsulant material disposed so as to cover the light incident side of said photovoltaic device, at least a portion of the encapsulant material which covers the light incident side of said photovoltaic device being light transmissive; and
   a body of contact adhesive covering at least a portion of the second side of said substrate.

2. The building material of claim 1 further including a release coating covering said contact adhesive.

3. The building material of claim 1 wherein said contact adhesive is a rubberized asphalt.

4. The building material of claim 1, wherein the first side of said substrate includes a body of contact adhesive thereupon, and wherein said photovoltaic device is affixed to said substrate by said body of contact adhesive.

5. The building material of claim 4, wherein said substrate comprises a monolithic body of an elastomeric contact adhesive material.

6. The building material of claim 1, wherein said encapsulant material affixes said photovoltaic device to said substrate.

7. The building material of claim 1, further including a plurality of photovoltaic devices supported on the substrate so that a bottom side of each photovoltaic device faces the first side of said substrate, and so that a top, light incident side of each photovoltaic device faces away from said substrate, and wherein said encapsulant material covers the light incident side of each of said photovoltaic devices.

8. The building material of claim 7, wherein said photovoltaic devices are spaced apart on said substrate.

9. The building material of claim 1, wherein said photovoltaic device is flexible.

10. The building material of claim 9, wherein said photovoltaic device includes at least one layer of a thin film semiconductor material selected from the group consisting of: silicon alloy materials, germanium alloy materials, and silicon-germanium alloy materials.

11. The building material of claim 1, wherein said substrate comprises a body of material selected from the group consisting of: sheet metal, polymeric membranes, fibrous material impregnated with an organic polymer, a monolithic body of an elastomeric adhesive, and combinations thereof.

12. The building material of claim 1, wherein said encapsulant material is selected from the group consisting of: fluoropolymers, ethylenevinylacetate, and combinations thereof.

13. The building material of claim 1, wherein said encapsulant material comprises a polymeric material having glass fibers disposed therein.

14. The building material of claim 7, wherein said photovoltaic devices are electrically interconnected.

15. The building material of claim 1, further including a first terminal and a second terminal which are in electrical communication with said photovoltaic device.

16. The building material of claim 15, wherein said terminals are disposed in a junction box which is supported on said substrate.

17. The building material of claim 1, characterized in that the weight thereof is no more than two pounds per square foot.

18. The building material of claim 1, wherein said body of contact adhesive covers all of the second side of said substrate.

19. A photovoltaic power generating module comprising:
the photovoltaic building material of claim 1; and
a support member, said photovoltaic building material being adhesively affixed to said support member by said body of contact adhesive.

20. A photovoltaic roofing material comprising:
a generally planar, flexible substrate having a first side and a second side opposed to said first side;
a plurality of photovoltaic devices each photovoltaic device being operative to generate an electrical current in response to the absorption of light incident thereupon, said photovoltaic devices being electrically interconnected and supported on said substrate in a spaced apart relationship so that a bottom side of each photovoltaic devices faces the first side of said substrate, and so that a top, light incident, side of each photovoltaic device faces away from said substrate;
an encapsulant material disposed so as to cover the light incident sides of said photovoltaic devices and to affix said photovoltaic devices to said substrate, at least a portion of the encapsulant material which covers the light incident sides of said photovoltaic devices being light transmissive;
a body of contact adhesive covering at least a portion of the second side of said substrate; and
a pair of electrical terminals supported upon said substrate, said terminals being in electrical communication with said plurality of photovoltaic devices.

21. The roofing material of claim 19, characterized in that the weight thereof is no more than two pounds per square foot.

22. A photovoltaic power generating module comprising:
I. a photovoltaic building material comprising:
a generally planar, flexible substrate having a first side and a second side opposed to said first side;
a photovoltaic device operative to generate an electrical current in response to the absorption of light incident thereupon, said photovoltaic device being affixed to said substrate so that a bottom side thereof faces the first side of said substrate, and so that a top, light incident, side thereof faces away from said substrate;
an encapsulant material disposed so as to cover the light incident side of said photovoltaic device, at least a portion of the encapsulant material which covers the light incident side of said photovoltaic device being light transmissive; and
a body of contact adhesive covering at least a portion of the second side of said substrate; and
II. a support member, said support member having said photovoltaic building material adhesively affixed thereto by said body of contact adhesive.

23. The photovoltaic power generating module of claim 22, wherein said support member comprises a polymeric material.

24. The photovoltaic power generating module of claim 23, wherein said polymeric material comprises a polycarbonate polymer.

25. The photovoltaic power generating module of claim 23, wherein said polymeric material comprises a polypropylene core member.

26. The photovoltaic power generating module of claim 22 further including at least one ancillary member selected from the group consisting of: inverters, transformers, battery charge controllers, batteries, capacitors, illumination controllers, sources of light, electrical terminals, and junction boxes.

27. The photovoltaic power generating module of claim 26, wherein said at least one ancillary member is affixed to said support member.

28. The photovoltaic power generating module of claim 26, wherein said photovoltaic building material is adhesively affixed to a first side of said support member, and said at least one ancillary member is adhesively affixed to a second side of said support member.

29. A method for the fabrication of a photovoltaic power generating module, said method comprising the steps of:
I. providing a photovoltaic building material, said photovoltaic building material comprising:
a generally planar, flexible substrate having a first side and a second side opposed to said first side;
a photovoltaic device operative to generate an electrical current in response to the absorption of light incident thereupon, said photovoltaic device being affixed to said substrate so that a bottom side thereof faces the first side of said substrate, and so that a top, light incident side thereof faces away from said substrate; and
a body of contact adhesive covering at least a portion of the second side of said substrate; and
II. providing a generally planar support member having a first side, and a second side opposed to said first side, said support member having a size corresponding to the intended size of said photovoltaic power generating module; and
III. adhesively affixing said photovoltaic building material to the first side of said support member by means of said body of contact adhesive.

30. The method of claim 29 including the further steps of:
IV. selecting at least one ancillary member from the group consisting of: inverters, transformers, battery charge controllers, batteries, capacitors, illumination controllers, sources of light, electrical terminals, and junction boxes; and
V. affixing said at least one ancillary member to said support member.

31. The method of claim 30, wherein said step of affixing said at least one ancillary member comprises affixing said at least one ancillary member to the second side of said support member.

32. The method of claim 30, wherein said step of affixing said at least one ancillary member to said support member comprises adhesively affixing said at least one ancillary member.

33. The method of claim 29, wherein said step of providing said support member comprises providing a body of polymeric material.

34. The method of claim 33, wherein said body of polymeric material comprises a sheet of polycarbonate polymer.

35. The method of claim 33, wherein said body of polymeric material comprises a polypropylene core member.

36. The method of claim 33, wherein said body of polymeric material comprises a sheet having a length of eight feet and a width of four feet.

* * * * *